(12) United States Patent
Gilton

(10) Patent No.: US 6,437,417 B1
(45) Date of Patent: Aug. 20, 2002

(54) METHOD FOR MAKING SHALLOW TRENCHES FOR ISOLATION

(75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 09/639,090

(22) Filed: Aug. 16, 2000

(51) Int. Cl.⁷ .............................................. H01L 29/00
(52) U.S. Cl. ...................................... 257/506; 438/424
(58) Field of Search ........................ 257/506; 438/424, 438/433, 425, 199, 435; 29/578; 434/424; 437/62

(56) References Cited

U.S. PATENT DOCUMENTS

| | | | | |
|---|---|---|---|---|
| 4,063,901 A | * | 12/1977 | Shiba ........................... | 29/578 |
| 5,110,755 A | * | 5/1992 | Chen et al. ................... | 437/62 |
| 5,719,085 A | * | 2/1998 | Moon et al. ................. | 438/424 |
| 5,783,476 A | * | 7/1998 | Arnold ....................... | 438/425 |
| 5,795,801 A | * | 8/1998 | Lee ............................. | 438/199 |
| 5,910,018 A | * | 6/1999 | Jang ............................ | 438/425 |
| 5,937,309 A | * | 8/1999 | Chuang ....................... | 438/424 |
| 5,950,093 A | | 9/1999 | Wei | |
| 5,956,598 A | | 9/1999 | Huang et al. | |
| 5,981,353 A | | 11/1999 | Tsai | |
| 6,001,707 A | * | 12/1999 | Lin et al. ..................... | 438/433 |
| 6,020,621 A | * | 2/2000 | Wu ............................. | 257/506 |
| 6,207,532 B1 | * | 3/2001 | Lin et al. ..................... | 438/424 |
| 6,270,353 B1 | * | 7/2001 | Andrews et al. ............ | 434/424 |
| 6,313,010 B1 | * | 11/2001 | Nag et al. ................... | 438/435 |

* cited by examiner

*Primary Examiner*—Hoai V. Ho
*Assistant Examiner*—Thinh Nguyen
(74) *Attorney, Agent, or Firm*—Dickstein Shapiro Morin & Oshinsky LLP

(57) ABSTRACT

An improved method for forming shallow trench isolation structures having reduced stress and allowing for greater control over shape, size and characteristics of the shallow trench isolation structures is disclosed. The isolation trench is defined by implanting a substrate through a patterned mask to create heavily doped regions. These heavily doped regions are anodized to form porous silicon and then oxidized. The oxidized porous silicon is removed, leaving behind a trench having rounded corners which is filled with an isolation dielectric.

74 Claims, 8 Drawing Sheets

METHOD FOR MAKING SHALLOW TRENCHES FOR ISOLATION

FIELD OF THE INVENTION

The present invention relates to the field of semiconductor integrated circuits and, in particular, to an improved structure and method for making shallow trenches for isolation.

BACKGROUND OF THE INVENTION

Shallow trench isolation (STI) is an essential part of current fabrication methods for microelectronic circuits. The decreasing dimensions of devices and the increasing density of integration in microelectronic circuits have required a corresponding reduction in the size of isolation structures. This reduction places a premium on reproducible formation of structures which provide effective isolation, while occupying a minimum amount of the substrate surface.

The STI technique is a widely used semiconductor fabrication method for forming isolation structures to electrically isolate the various active components formed in integrated circuits. In the STI technique, the first step is the formation of a plurality of trenches at predefined locations in the substrate, usually by anisotropic etching, followed by the deposition of an oxide into each of these trenches to form an STI structure. One major advantage of using the STI technique over the conventional LOCOS (Local Oxidation of Silicon) technique is the high scalability to CMOS (Complementary Metal-Oxide Semiconductor) IC devices for fabrication at the submicron level of integration. Another advantage is that the STI technique helps prevent the occurrence of the so-called bird's beak encroachment, which is characteristic to the LOCOS technique for forming isolation structures.

Traditional STI fabrication methods have several drawbacks. One problem arises due to stress in the bottom of the trench. The rectangular corners formed at the bottom of STI trenches fabricated by traditional methods can lead to stress and dislocations in the isolation dielectric. This can further lead to current leakage paths and contaminants, which in turn reduce the effectiveness of the isolation structure. U.S. Pat. No. 5,956,598 provides a method for rounding the corners of STI structures, but the method described in this reference requires a high temperature anneal, which may not be compatible with the thermal budget of some fabrication processes.

Depth control of the isolation trench poses another problem. As shallower trenches become increasingly necessary or desirable, any process variability during trench formation takes on greater importance. As a result, dry etch processes, which have tolerable process variations for deeper trenches, become increasingly less acceptable for shallower trench structures.

A further limitation of the current art stems from the photolithography techniques. Isolation structures created by conventional STI methods have a minimum width that is determined by the resolution of current photolithography methods. Additionally, traditional STI methods are primarily designed for creation of trenches with a uniform, simple rectangular shape.

Accordingly, there is a need for an improved method for fabricating a shallow trench isolation region that reduces the stress in the trench structure without resorting to high temperature anneal steps. There is also needed a method for isolation that allows for reproducible creation of shallow trenches with a minimum of depth variation in the resulting trench structure, as well as a method of creating isolation structures that are narrower than current photolithographic resolution limits. A method for creating isolation structures with non-rectangular depth profiles is also desirable.

SUMMARY OF THE INVENTION

The present invention provides an improved method for creating shallow trench isolation structures. In one embodiment, a patterned mask is formed on a semiconductor substrate. The substrate is then subjected to dopant implantation to form highly doped regions in the non-masked portions of the substrate. After implantation, the highly doped regions are first anodized and then oxidized, leading to the formation of a porous oxide. This porous oxide is removed by a wet etching process, leaving behind a trench with exposed silicon. The trench is then oxidized and filled with a conventional suitable dielectric. The process produces a shallow trench with rounded corners which reduces mechanical stresses at the isolation region boundaries.

In another embodiment, a patterned hard mask is formed on a semiconductor substrate. The substrate is then subjected to a first dopant implantation, after which a spacer is formed on the patterned features of the mask. This results in a narrower mask feature. The wafer is then subjected to a second dopant implantation with a higher implantation energy. The resulting dopant profile in the substrate has a non-rectangular, tiered structure with a shallower, wider portion above a deeper, narrower portion. After both implantations, the highly doped regions are anodized and then oxidized, leading to the formation of porous oxide. This porous oxide is removed by a wet etching technique, leaving behind a trench with exposed silicon. The trench is then oxidized and filled with a conventional suitable dielectric. The isolation region again has rounded corners which reduce mechanical stresses at the isolation region boundaries.

In yet another embodiment, a patterned mask is formed on a semiconductor substrate, which has some of the pattern features at or near the resolution limit of the photolithography technique. A spacer is then formed on the patterned features of the mask and the substrate is subjected to a dopant implantation. Subsequently, highly doped regions, formed in the non-masked portions of the substrate, are anodized to become porous silicon regions. The porous silicon regions are then oxidized, forming regions of oxidized porous silicon. The porous oxide of the oxidized porous silicon regions is then removed by a wet etching, leaving behind trenches with exposed silicon surfaces. A preparation layer may be formed in these trenches, either by oxidizing the trenches or by depositing a thin dielectric layer in the trenches. In any case, the trenches are then filled with a conventional suitable dielectric. The isolation region again has rounded corners which reduce mechanical stresses at the isolation region boundaries.

In still another embodiment, a patterned mask is formed on a semiconductor substrate with optional spacers on the features of the patterned mask. If spacers are used, the mask must be a hard mask. The substrate is the subjected to an angled dopant implantation, at a fixed or varying angle, so that heavily doped regions with non-rectangular geometries are formed in the substrate. After implantation, the non-rectangular heavily doped regions are anodized to form porous silicon regions. The anodized regions are later oxidized to form a porous oxide. This porous oxide is then removed by a wet etching, leaving behind trenches with exposed silicon surfaces. The trenches are then filled with a conventional suitable dielectric. The isolation region again has rounded corners which reduce mechanical stresses at the isolation region boundaries.

The foregoing and other advantages and features of the invention will be better understood from the following detailed description of the invention, which is provided in connection with the accompanying drawings.

DETAILED DESCRIPTION OF THE DRAWINGS

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure that has an exposed silicon surface. Structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a substrate in the following description, previous process steps may have been utilized to form regions or junctions in the base semiconductor or foundation.

The present invention provides a method for creating shallow trench isolation features, with rounded corners to minimize stress in the trench. The invention also provides a process with improved process reliability, reducing the amount of process variability in the total trench depth.

Figure 1:
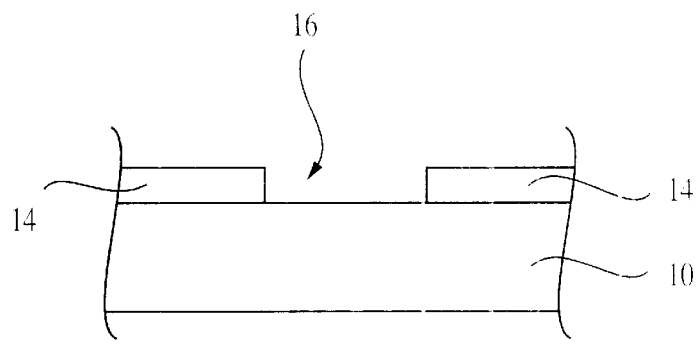
FIG. 1 is a schematic cross-sectional view of a representative substrate undergoing the formation of a shallow trench isolation structure, performed in accordance with a method of a first embodiment of the present invention.

Referring now to the figures, where like elements are designated by like reference numerals, FIGS. 1–6 depict the formation of a shallow trench isolation feature on a silicon substrate in accordance with a method of the present invention. FIG. 1 depicts a portion of a semiconductor substrate 10 with a patterned mask layer 14 already formed on it. Substrate 10 may be composed of either undoped silicon or lightly doped bulk silicon (either N-type or P-type). An opening 16 is formed in patterned mask layer 14 by any suitable method. For example, if patterned mask layer 14 is made of photoresist, then opening 16 may be formed by any standard photolithography technique.

As it will be described bellow, some embodiments require patterned mask layer 14 to be composed of a hard mask material, such as silicon nitride or silicon oxide. In such embodiments, the patterned mask layer 14 may be formed by first depositing a blanket layer of hard mask material, then forming a patterned layer of photoresist above the hard mask material, and transferring the pattern from the photoresist to the hard mask material. Methods and materials for forming suitable patterned mask layers 14 will be apparent to those skilled in the art. Further, although only a portion of substrate 10 is depicted in FIGS. 1–19, it should be understood that the present invention contemplate simultaneous creation of multiple shallow trench isolation features at various locations on a substrate.

Figure 2:
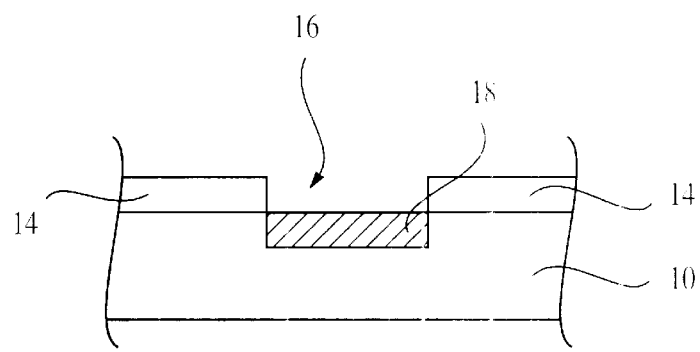
FIG. 2 is a cross-sectional view of the representative substrate of FIG. 1 and at a stage of processing subsequent to that shown in FIG. 1.

FIG. 2 depicts substrate 10 after a dopant implantation step. Most of the substrate 10 is unaffected by the dopant implant due to the presence of the mask layer 14. The opening 16 in mask layer 14, however, permits dopants to reach the substrate, and to form therefore a highly doped region 18 in the substrate 10. In all the embodiments of this application, a highly doped region is one which has a mean dopant distribution at a depth of approximately 1,000 Angstroms, of $1 \times 10^{13}$ atoms/cm$^3$ or greater.

Either P-type or N-type dopants may be used during the dopant implantation step. P-type dopants, such as $BF_2$ and B (boron), are generally preferred during the implantation step. Some of the relative advantages of P-type and N-type dopants will be discussed bellow in connection with the anodization step.

After dopant implantation, the substrate 10 may be annealed. Annealing will lead to smoother edge profiles for heavily doped region 18. Nevertheless, annealing will also lead to lateral drift of dopants in the substrate, which will further lead to lateral expansion of heavily doped region 18. Unfortunately, this lateral drift will increase the ultimate size of the isolation feature, which may not be acceptable in many closely packed geometries. Thus, depending upon further processing steps undergone by the substrate 10, annealing may or may not be performed.

Figure 3:
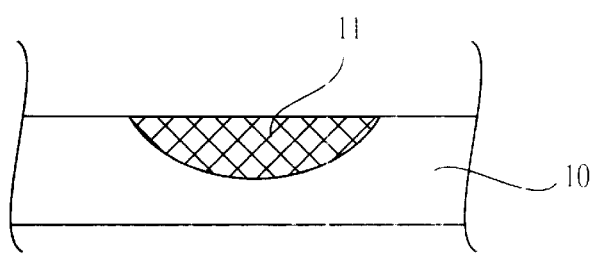
FIG. 3 is a cross-sectional view of the representative substrate of FIG. 1 and at a stage of processing subsequent to that shown in FIG. 2.

Referring now to FIG. 3, after dopant implantation and any annealing, the implantation mask 14 is removed. The parameters of the mask removal step vary depending on the nature of the mask. For example, if the mask 14 is composed of photoresist, the removal step could include oxygen ashing of the photoresist followed by a residual cleaning step. The residual cleaning step might include use of a mixture of $H_2SO_4$ and $H_2O_2$, or it might include use of organic solvents, depending on what is present on the surface of the substrate. Similarly, a mask removal step for a $Si_3N_4$ mask might include treating the substrate with hot $H_3PO_4$.

After the removal of mask 14, heavily doped region 18 is anodized to form a porous silicon region 11, as shown in FIG. 3. Anodization may be performed by exposing the substrate 10 to a bath of HF and isopropyl alcohol (IPA) in the presence of an electric current. In an exemplary embodiment, the anodization solution is composed of 1 part HF (49% by weight in $H_2O$) and 1 part IPA (100%), in other words, the solution is 49 parts HF, 51 parts $H_2O$ and 1 part IPA. Substrate 10 is exposed to the HF/IPA solution, which in turn is sourced or connected to a low current, high voltage power supply. For the present invention, high voltage is defined to be in the range of 20–30 Volts. In onother embodiment, multiple substrates may be suspended in a single HF/IPA bath for anodization in a batch process. In any case, as exemplified by the dimensions of regions 18 and 11 of FIGS. 2 and 3, anodization will convert a given volume of heavily doped silicon 18 into a larger volume of porous silicon 11.

If the heavily doped silicon region 18 is doped with N-type dopants, then the anodization step must also include exposing the substrate to visible or ultraviolet radiation because, in the absence of such radiation, silicon doped with N-type dopants will not anodize. Thus, in preferred embodiments, heavily doped silicon region 18 is doped with P-type dopants, as this potentially allows for selective anodization of the substrate. If heavily doped regions of both P-type and N-type dopants are present, the P-type regions may be selectively anodized by not exposing the substrate to visible or ultraviolet light during the anodization process.

Figure 4:
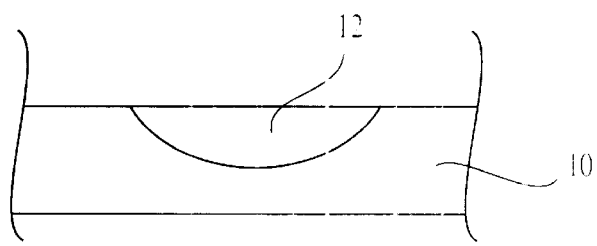
FIG. 4 is a cross-sectional view of the representative substrate of FIG. 1 and at a stage of processing subsequent to that shown in FIG. 3.

In the next process step, the porous silicon 11 of FIG. 3 is oxidized to form an oxidized porous silicon region 12, as illustrated in FIG. 4. A preferred embodiment for oxidizing porous silicon region 11 is using a rapid thermal oxidation process at temperatures of about 350° C. to 550° C. In an exemplary embodiment, the rapid thermal oxidation is carried out at 450° C. Since porous silicon is more susceptible to oxidation than typical bulk silicon, the porous silicon region 11 may be oxidized with a process that will lead to only minimal oxidation of other portions of substrate 10. Thus, by using a 450° C. oxidation process, or another low temperature oxidation process, the porous silicon region 11 can be oxidized to form oxidized porous silicon region 12, with a minimum impact on the substrate 10. A low temperature oxidation process will also minimize the amount of dopant diffusion that occurs during oxidation of the porous silicon region 11.

Figure 5:
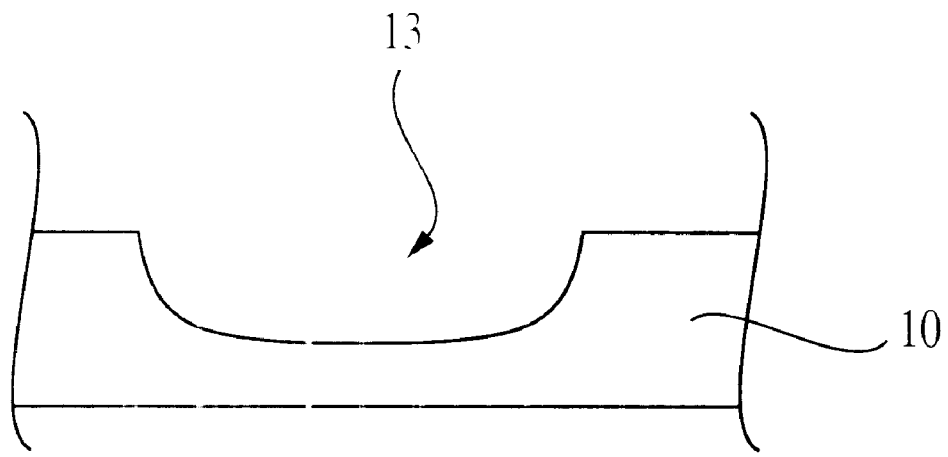
FIG. 5 is a cross-sectional view of the representative substrate of FIG. 1 and at a stage of processing subsequent to that shown in FIG. 4.

Referring now to FIG. 5, once the porous silicon region 11 is oxidized to form oxidized porous silicon region 12 (FIG. 4), the oxidized porous silicon is removed to form a trench 13. In a preferred embodiment, the oxidized porous silicon is removed by treating the substrate 10 with a wet etchant, such as a solution of dilute HF. One exemplary solution is a 10:1 dilution in $H_2O$ of 49% HF. At room temperature, this dilute HF solution will etch the oxidized porous silicon at approximately 250 Angstroms/minute.

Substrate 10 is treated with a wet etchant at room temperature for a time sufficient to overetch the oxidized porous silicon region 12 (FIG. 4) by 10%. Given a fixed trench depth of oxidized porous silicon and a fixed etch rate, such as 250 Angstroms/minute, the time necessary to remove all of the porous silicon can be calculated. A 10% overetch can be achieved by multiplying this calculated etch time by 1.1. The 10% overetch results in the formation of trench 13 of FIG. 5 with exposed bare silicon, since, as explained above, all oxidized porous silicon is removed.

Figure 6:
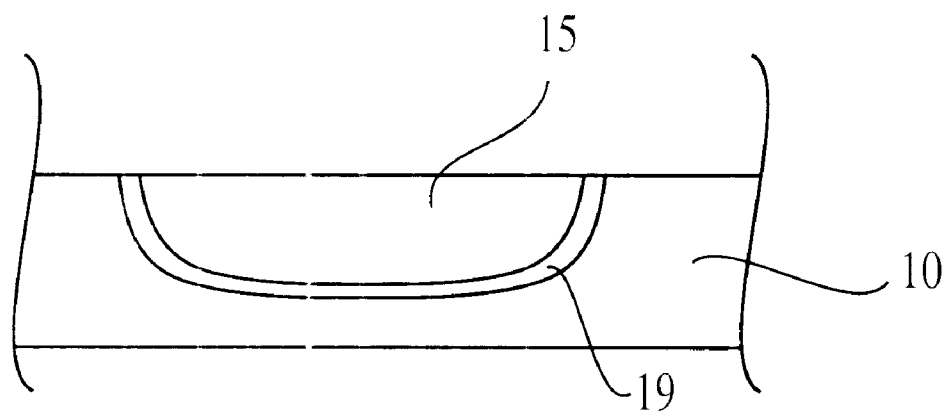
FIG. 6 is a cross-sectional view of the representative substrate of FIG. 1 and at a stage of processing subsequent to that shown in FIG. 5.

At this point, the trench 13 of FIG. 5 can be filled with an isolation dielectric 15, illustrated in FIG. 6. Any dielectric suitable for isolation may be employed to fill trench 13. In a preferred embodiment, trench 13 is filled with high density plasma (HDP) oxide, a material which has a high ability to effectively fill narrow trenches.

Alternatively, an insulating layer 19 (FIG. 6) may be formed on the trench sidewalls prior to filling the trench 13 with the dielectric 15. In one embodiment, the insulating layer 19 is formed by oxidizing the trench walls. In another embodiment, the insulating layer 19 is formed by depositing a layer of silicon nitride. In any case, the insulating layer aids in smoothing out the corners in the bottom of the trench and reducing the amount of stress in the dielectric used later to fill the trench.

The masking and implant steps of the above embodiment provide for a trench with a generally rectangular shape, but with considerably rounded corners within the substrate. In the embodiments that will be described in more details bellow, the masking and implant steps may be selected to provide for a trench with a tiered structure (such as trench 32 of FIGS. 15, 16) or for a trench with a light-bulb shape (such as structure 58 of FIG. 18). The tiered structure of the second embodiment will now be described in more detail bellow, with reference to FIGS. 7–16.

Figure 7:
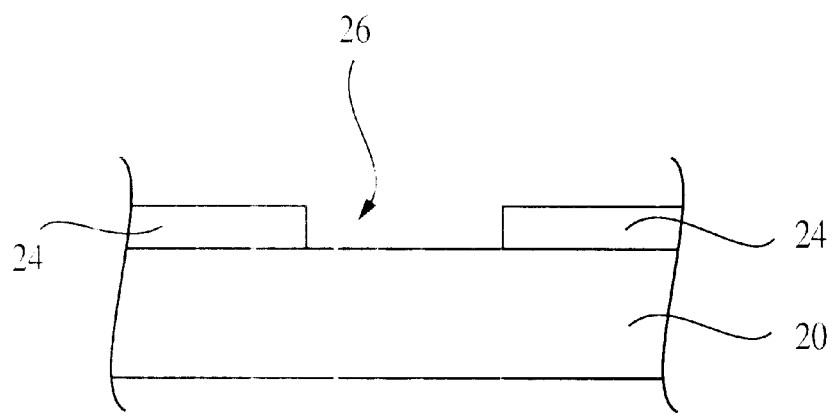
FIG. 7 is a schematic cross-sectional view of a representative substrate undergoing the formation of a shallow trench isolation structure, performed in accordance with a method of a second embodiment of the present invention.
Figure 15:
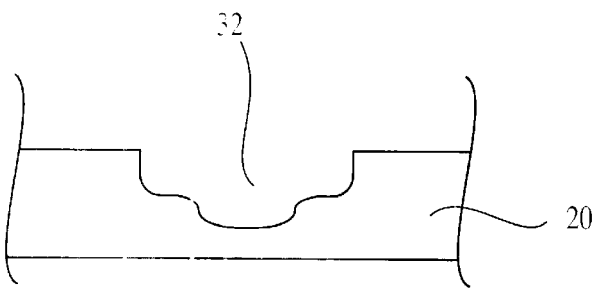
FIG. 15 is a cross-sectional view of the representative substrate of FIG. 7 and at a stage of processing subsequent to that shown in FIG. 14.
Figure 16:
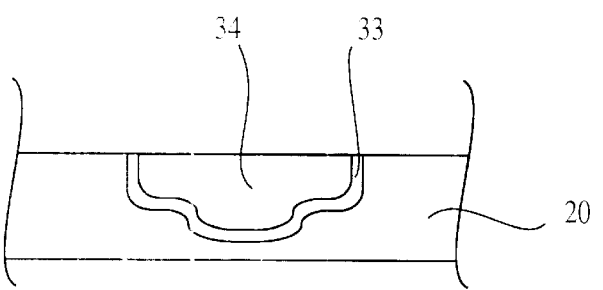
FIG. 16 is a cross-sectional view of the representative substrate of FIG. 7 and at a stage of processing subsequent to that shown in FIG. 15.

FIG. 7 depicts a portion of a representative substrate 20 processed according to a second embodiment of the present invention, to form tiered STI structure 34 (FIGS. 15, 16). As shown in FIG. 7, a first implantation mask 24 has already been deposited on the surface of substrate 20. The first implantation mask 24 is a hard masking layer, such as a silicon oxide or silicon nitride. An opening 26 is formed in the first implantation mask 24, to expose a portion of substrate 20.

Figure 8:
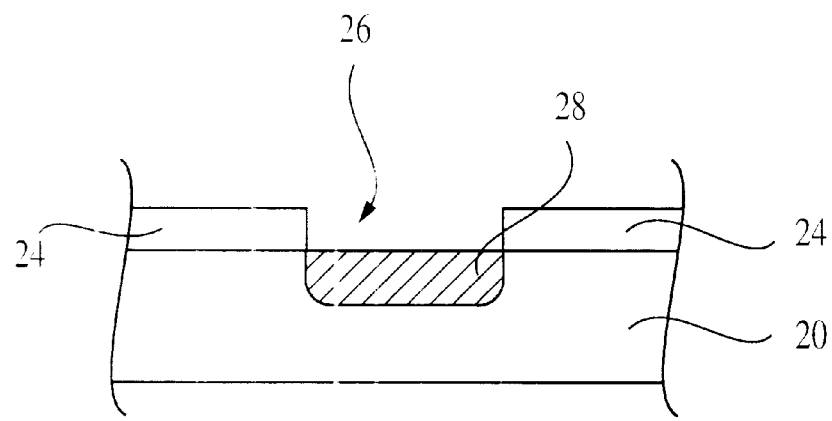
FIG. 8 is a cross-sectional view of the representative substrate of FIG. 7 and at a stage of processing subsequent to that shown in FIG. 7.

Next, substrate 20 is subjected to a first dopant implantation, to form a heavily doped region 28, as illustrated in FIG. 8. Most of the substrate 20 is unaffected by the dopant implant due to the presence of the first implantation mask 24. Only opening 26 of the first implantation mask 24 permits dopants to reach the substrate 20 and to create highly doped region 28 in the substrate 20.

Figure 9:
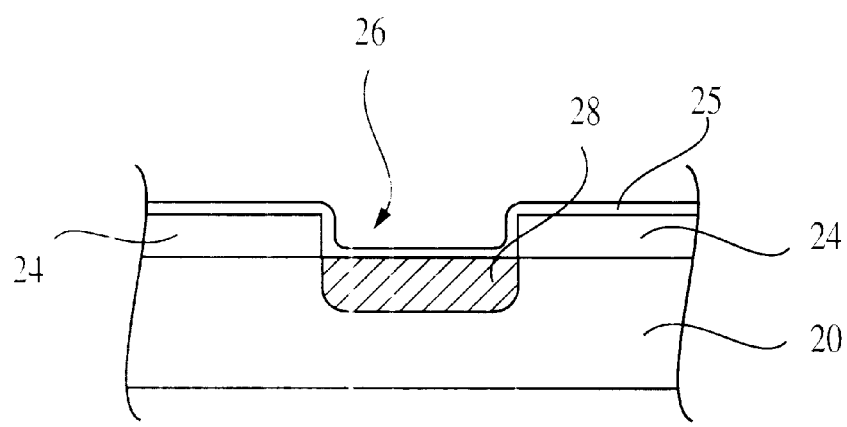
FIG. 9 is a cross-sectional view of the representative substrate of FIG. 7 and at a stage of processing subsequent to that shown in FIG. 8.

Referring now to FIG. 9, after the first dopant implantation, an oxide layer 25 is formed on the substrate 20, over the first mask 24 and over the exposed upper surface of the heavily doped region 28. The oxide layer 25, which can be for example TEOS, could be formed by a method that allows the coating of any exposed surfaces of the substrate 20 and of the first implantation mask 24. This includes the sidewalls of any openings 26 in the first implantation mask 24. The portions of the oxide layer 25 residing on the sidewalls of the opening 26 will eventually provide a spacer in the opening 26.

Figure 10:
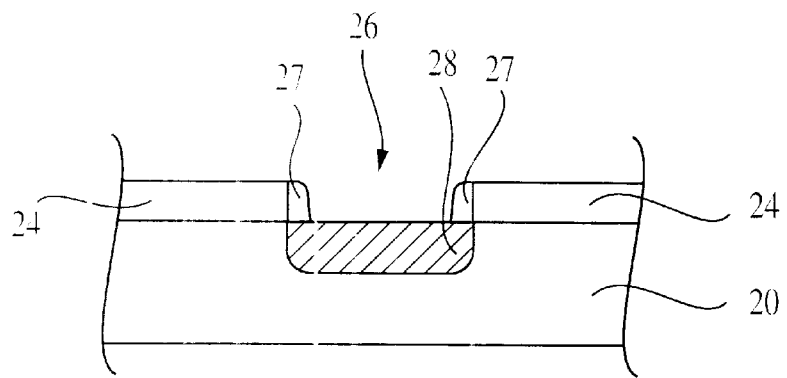
FIG. 10 is a cross-sectional view of the representative substrate of FIG. 7 and at a stage of processing subsequent to that shown in FIG. 9.

After the formation of the oxide layer 25, any portions of the oxide layer 25 residing on horizontal surfaces are removed to obtain the structure of FIG. 10. A conventional process for the removal of such surfaces is a spacer etch, for example. The removal of all horizontal portions leaves behind only those portions of the oxide layer 25 residing on vertical surfaces, that are spacers 27 (FIG. 10). As a result, substrate 20 is once again exposed for processing through opening 26, but opening 26 is now narrower due to the presence of spacers 27.

Figure 11:
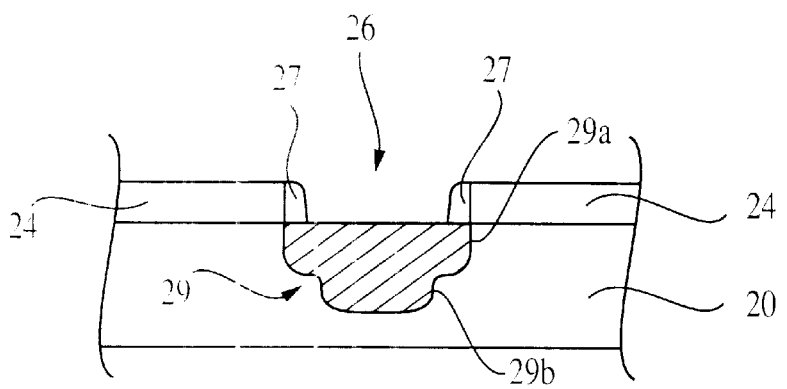
FIG. 11 is a cross-sectional view of the representative substrate of FIG. 7 and at a stage of processing subsequent to that shown in FIG. 10.
Figure 12:
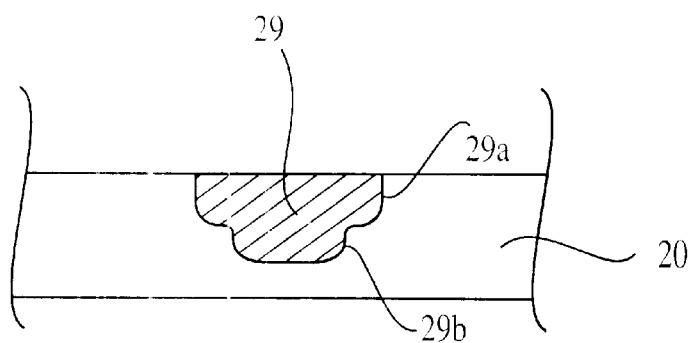
FIG. 12 is a cross-sectional view of the representative substrate of FIG. 7 and at a stage of processing subsequent to that shown in FIG. 11.

Once spacers 27 are formed and opening 26 becomes narrower, the substrate 20 is subjected to a second dopant implantation, involving the same or a different dopant as the one used in the first implantation, to form a heavily doped region 29, as shown in FIG. 11. The target concentration for the second dopant implantation may be selected independently from the concentration value of the first implantation, however, the implantation energy of the second implantation should be higher than the implantation energy of the first implantation. Selecting a higher implantation energy will lead to the creation of a deeper doped region 29b, as illustrated in FIG. 11. Since the presence of spacers 27 on each side of the opening 26 will confer a narrower shape to the deeper doped region 29b, the heavily doped region 29 acquires a tiered structure (29a,b) at the end of the second implantation. Thus, as illustrated in FIG. 11, the wider, shallower portion 29a of heavily doped region 29 is due to the first dopant implantation, while the narrower, deeper portion 29b is due to the second dopant implantation.

Once heavily doped region 29 has been created with the tiered structure shown in FIG. 11, the remainder of the invention may be carried out in a manner similar to the first embodiment detailed above. Accordingly, the implantation mask 24 and spacers 27 are removed from the substrate 20 to form the structure of FIG. 12, by using removal processes that vary according to the nature of the mask 24 and oxide 25. For example, oxygen ashing followed by a residual cleaning step may be employed for a photoresist mask. Similarly, treating the substrate with hot $H_3PO_4$ is employed for a $Si_3N_4$ mask.

Figure 13:
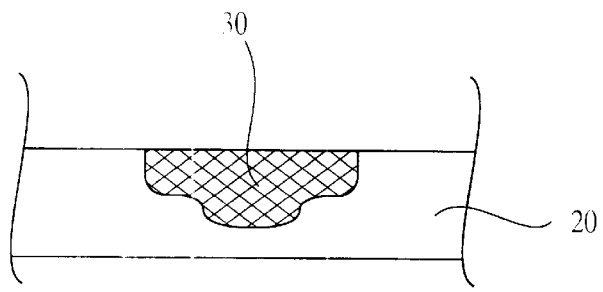
FIG. 13 is a cross-sectional view of the representative substrate of FIG. 7 and at a stage of processing subsequent to that shown in FIG. 12.
Figure 14:
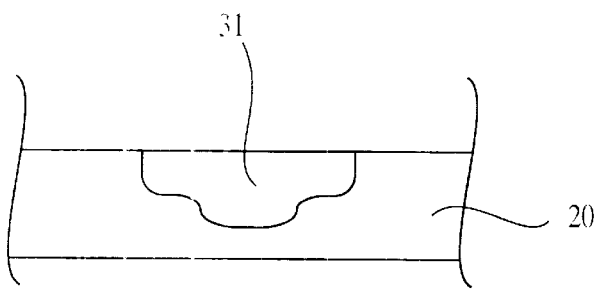
FIG. 14 is a cross-sectional view of the representative substrate of FIG. 7 and at a stage of processing subsequent to that shown in FIG. 13.

The heavily doped regions 29a,b are anodized to form a porous silicon region 30 (FIG. 13). The porous silicon region 30 is then oxidized to form oxidized silicon region 31 (FIG. 14). The anodization and oxidation steps of the second embodiment may be carried out in a way similar to that described for the first embodiment and with reference to FIGS. 3–4. Next, the oxidized porous silicon of the oxidized region 31 is removed, leaving behind a trench 32 (FIG. 15) with a tiered structure. As in the first embodiment, an insulating layer 33 (FIG. 16) may be formed in the tiered trench 32. Finally, the tiered trench 32 is filled with an isolation dielectric 34, preferably an HDP oxide (FIG. 16).

Figure 17:
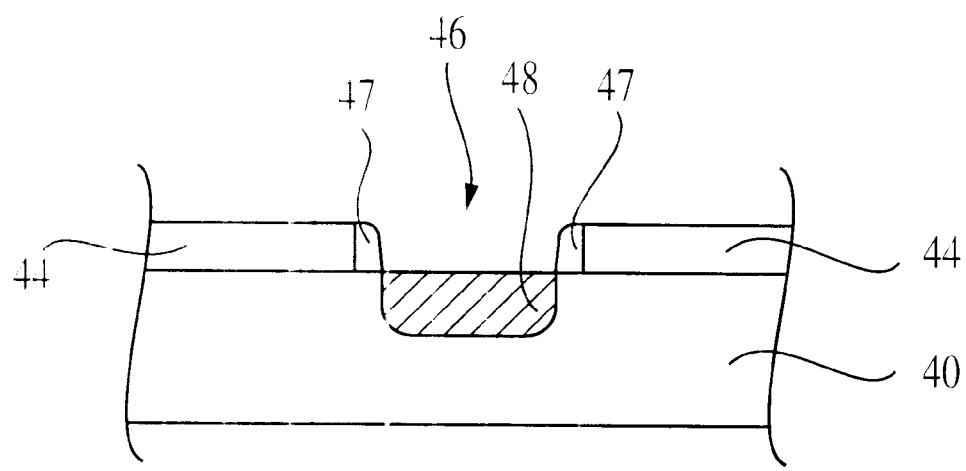
FIG. 17 is a schematic cross-sectional view of a representative substrate with a shallow trench isolation structure, performed in accordance with a method of a third embodiment of the present invention.

FIG. 17 depicts yet a third embodiment of the present invention useful for forming narrow isolation trenches. In FIG. 17, an implantation mask 44, formed on substrate 40, has been patterned to form an opening 46. Spacers 47 have also been formed in the opening 46, either by the method described above or by another suitable method. In this third embodiment, however, spacers 47 are formed prior to any dopant implantation. As described above, spacers 47 reduce the width of the opening 46.

The third embodiment allows for formation of isolation trenches that are narrower than the critical dimension of the available lithographic methods. This is accomplished by patterning the mask 44 to provide the narrowest possible opening 46 for the available lithography technology. After creating the opening 46, spacers 47 are formed within the opening 46, and thus an opening that may be narrower than the critical dimension of the lithography technique could be attained. After the formation of spacers 47, the substrate 40 is subjected to a dopant implantation. The reduced width of opening 46 will result in a reduced width of heavily doped region 48 (FIG. 17), and, accordingly, to a narrower isolation trench. As in the first embodiment, the heavily doped region 48 is anodized to form a porous silicon. The porous silicon is then oxidized and removed, preferably by wet etching, leaving behind a trench for the shallow trench isolation structure. An insulating layer may be optionally formed, after which the trench is filled with an isolation dielectric, such as HDP oxide.

Figure 18:
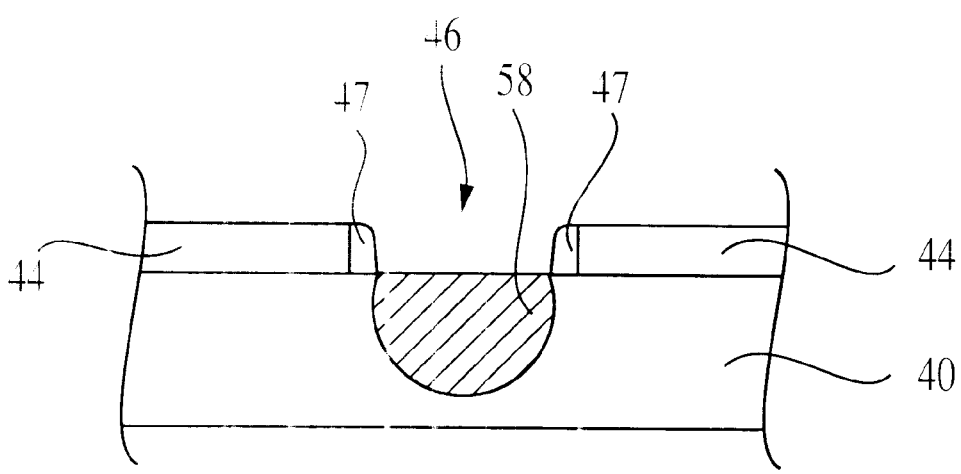
FIG. 18 is a schematic cross-sectional view of a representative substrate with a shallow trench isolation structure, performed in accordance with a method of a fourth embodiment of the present invention.

FIG. 18 depicts a fourth embodiment of the present invention. In this embodiment, same steps are used as for those for the third embodiment, depicted in FIG. 17, up until the dopant implantation step. In the forth embodiment, the dopant implantation is not carried out at a 90° angle to the substrate surface, but rather at incident angles that are not perpendicular to the plane of the substrate 40. By varying the incident angle at which the dopant implantation is performed, various geometries can be created for heavily doped region 58, such as the light-bulb shape depicted in FIG. 18. Also, because the size of the trench is determined by the dopant implantation, these alternate geometries can be created using openings that are narrower than the critical dimension imposed by the lithographic method.

As in the first embodiment, heavily doped region 58 is converted into a trench and then filled with an isolation dielectric. First, the heavily doped region is anodized to form a porous silicon. The porous silicon is then oxidized and removed, preferably by wet etching, leaving behind a trench for the shallow trench isolation structure. An insulating layer may be optionally formed, after which the trench is filled with an isolation dielectric, such as HDP oxide.

Subsequent to the formation of shallow trench structures for isolation, such as structure 15 of FIG. 6, structure 34 of FIG. 16, structure 48 of FIG. 17 and structure 58 of FIG. 18, further steps to create a functional memory cell may be carried out in accordance with conventional IC fabrication processes. For example, FIG. 19 depicts a conventional memory cell construction for a DRAM at an intermediate stage of the fabrication at which the cell access transistors are formed, and in which a STI structure, such as structure 15 of FIG. 6, has been formed in substrate 10 according to a method of the present invention.

Figure 19:
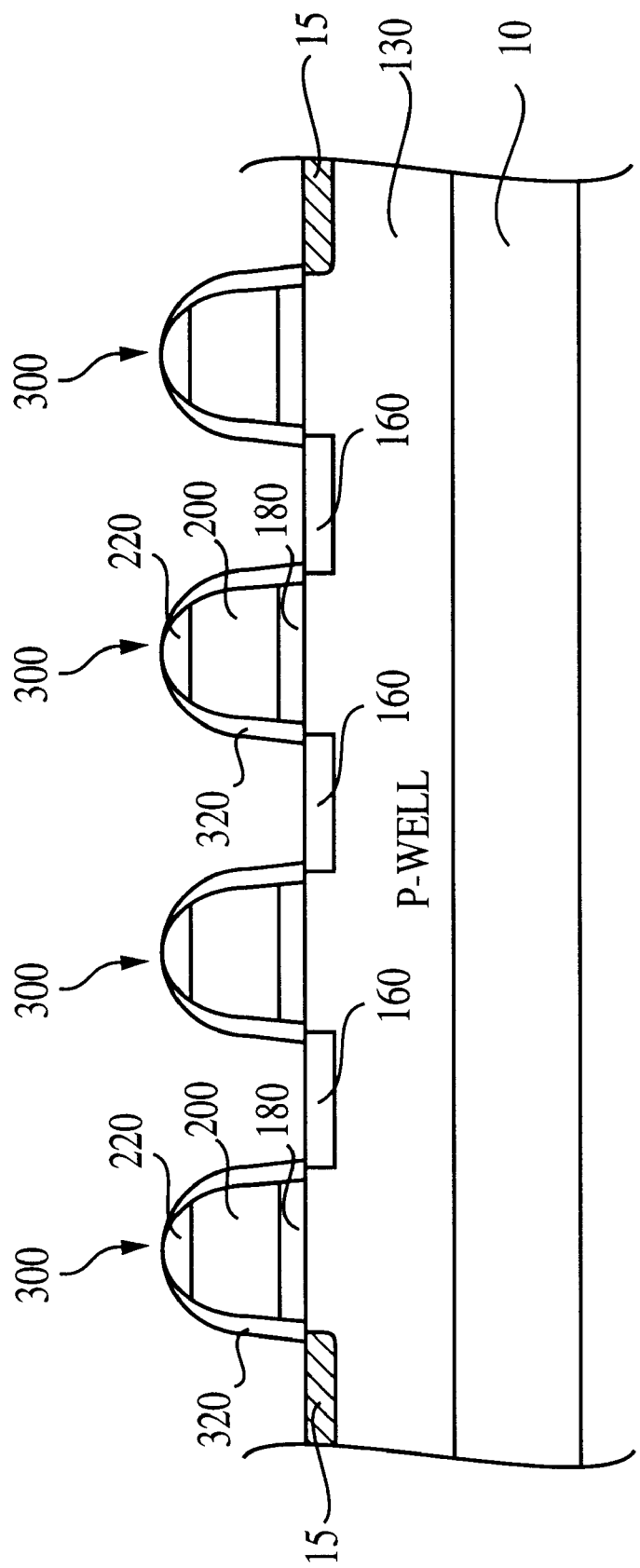
FIG. 19 is a schematic cross-sectional view of a portion of a conventional memory DRAM device with a shallow trench isolation structure formed in accordance with a method of the present invention.

As shown in FIG. 19, a pair of memory cells having respective access transistors are formed within a p-well 130 of substrate 10. The transistors of the cell are surrounded by the shallow trench isolation region 15 that provides electrical and physical isolation. N-type active regions 160 are provided in the doped p-well 130 of substrate 10 (for NMOS transistors) and the pair of access transistors have respective gate stacks 300, each of which includes an oxide layer 180, a conductive layer 200, such as polysilicon, nitride spacers 320, and a nitride cap 220. Next, as known in the art, polysilicon plugs, capacitors, metal contacts and bit lines could be formed in, or on, one or more insulating layers provided over the FIG. 19 structure using well-known techniques to produce operative DRAM cells.

Figure 20:
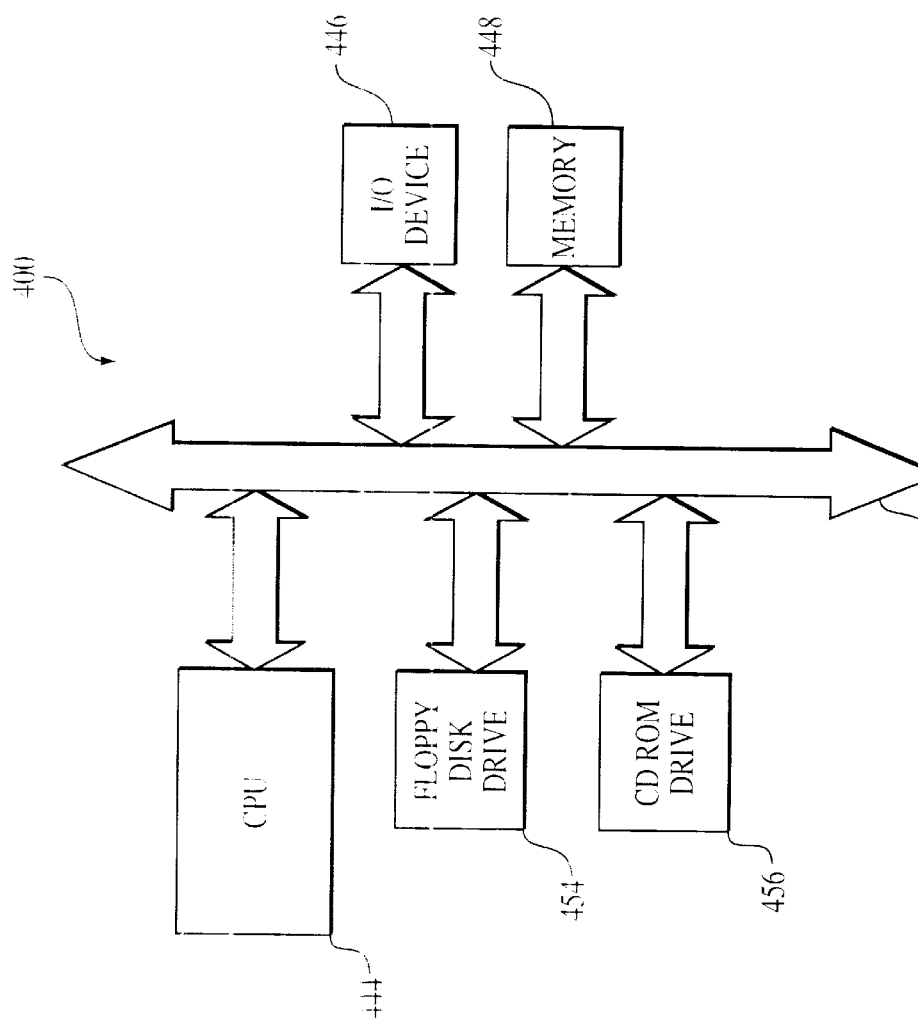
FIG. 20 is an illustration of a computer system having a memory cell with a shallow trench isolation structure formed in accordance with a method of the present invention.

The memory cells of FIG. 19, employing the shallow trench isolation region 15 fabricated in accordance with the present invention, could further be part of a typical processor based system, which is illustrated generally at 400 in FIG. 20. A processor system, such as a computer system, generally comprises a central processing unit (CPU) 444, such as a microprocessor, which communicates with an input/output (I/O) device 446 over a bus 452. A memory 448, having at least one shallow trench isolation region fabricated according to the present invention, also communicates with the CPU 444 over bus 452. In addition, the CPU 444 may itself contain regions isolated with at least one shallow trench isolation region fabricated according to the present invention.

In the case of a computer system, the processor system may include additional peripheral devices such as a floppy disk drive 454, and a compact disk (CD) ROM drive 456 which also communicate with CPU 444 over the bus 452. Memory 448 is preferably constructed as an integrated circuit, which includes shallow trench isolation region formed as previously described with respect to FIGS. 1–19. The memory 448 may be combined with a processor, such as a CPU, digital signal processor or microprocessor, with or without memory storage, in a single integrated circuit chip.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for creating a shallow trench isolation structure on a substrate comprising:
    forming patterned features of an implantation mask on said substrate, said mask containing at least one opening;
    implanting a first dopant into said substrate through said at least one opening of said implantation mask to form at least one doped region in said substrate;
    anodizing said substrate to convert said at least one doped region into a porous silicon region;
    oxidizing said porous silicon region;
    removing said oxidized porous silicon region to form a trench; and
    filling said trench with an isolation dielectric.

2. The method of claim 1, wherein said at least one doped region is a heavily doped region.

3. The method of claim 1, wherein said implantation mask comprises a photoresist.

4. The method of claim 1, wherein said implantation mask is a hard mask.

5. The method of claim 4, wherein said implantation mask comprises an oxide material.

6. The method of claim 4, wherein said implantation mask comprises a nitride material.

7. The method of claim 1 further comprising the step of removing said implantation mask subsequent to said first dopant implanting step.

8. The method of claim 1, wherein said first implanted dopants are P-type dopants.

9. The method of claim 8, wherein said first implanted dopant is boron.

10. The method of claim 8, wherein said first implanted dopant is $BF_2$.

11. The method of claim 1, wherein said step of first dopant implantation creates a doped region with a mean dopant distribution at a depth of approximately 1,000 Angstroms, of at least $1 \times 10^{13}$ atoms/cm$^3$.

12. The method of claim 1 further comprising the step of annealing said substrate subsequent to said first dopant implantation step and prior to said anodization step.

13. The method of claim 1, wherein said anodization step comprises exposing said substrate to an anodization solution of HF and an alcohol in the presence of an electric current.

14. The method of claim 13, wherein said alcohol is isopropyl alcohol.

15. The method of claim 13, wherein said anodization solution is composed by weight of 0.1 part isopropyl alcohol, 0.49 parts HF, and 0.51 parts water.

16. The method of claim 13, wherein said electric current has a voltage of between about 20 Volts to about 30 Volts.

17. The method of claim 1, wherein said porous silicon is oxidized by a rapid thermal oxidation process.

18. The method of claim 17, wherein said oxidation process occurs at a temperature of approximately 350° C. to approximately 550° C.

19. The method of claim 17, wherein said oxidation process occurs at a temperature of approximately 450° C.

20. The method of claim 1, wherein said oxidized porous silicon is removed by wet etching.

21. The method of claim 1, wherein said oxidized porous silicon is removed by etching with a dilute HF solution.

22. The method of claim 1, further comprising the step of forming an insulating layer in said trench after said oxidized porous silicon is removed from said trench and prior to filling said trench with said isolation dielectric.

23. The method of claim 22, wherein said insulating layer is an oxide layer.

24. The method of claim 22, wherein said insulating layer is a nitride layer.

25. The method of claim 1, wherein said isolation dielectric is an oxide.

26. The method of claim 25, wherein said oxide is produced by a high density plasma.

27. The method of claim 1 further comprising forming a spacer on said patterned features of said implantation mask subsequent to said first dopant implantation step.

28. The method of claim 27, further comprising the step of forming a second dopant implantation after said spacer forming step.

29. The method of claim 28, wherein said second implanted dopant is a P-type dopants.

30. The method of claim 29, wherein said second implanted dopant is boron.

31. The method of claim 29, wherein said second implanted dopant is $BF_2$.

32. The method of claim 28, wherein said step of second dopant implantation creates a doped region with a mean dopant distribution at a depth of approximately 1,000 Angstroms, of at least $1 \times 10^{13}$ atoms/cm$^3$.

33. The method of claim 25, wherein said spacer is formed of an oxide material.

34. The method of claim 28, wherein said spacer is formed of TEOS.

35. The method of claim 1 further comprising the step of forming a spacer on said patterned features of said implantation mask prior to said first dopant implantation step.

36. The method of claim 35, wherein said spacer is formed of an oxide material.

37. The method of claim 35, wherein said spacer is formed of TEOS.

38. The method of claim 1, wherein said dopant implantation step employs directing a dopant species at an angle of substantially 90° incidence to said substrate.

39. The method of claim 1, wherein said dopant implantation step employs directing a dopant species at angles other than substantially 90° incidence to said substrate.

40. A semiconductor device, comprising:
 a substrate; and
 a shallow trench isolation structure on said substrate for providing device isolation, said shallow trench isolation structure having rounded corners and a tiered profile.

41. The semiconductor device of claim 40, wherein said shallow trench isolation structure further comprises at least a first and second isolation regions.

42. The semiconductor device of claim 40, wherein said first isolation region intersects a surface of said substrate at a first predetermined width.

43. The semiconductor device of claim 40, wherein said second isolation region is formed bellow said first isolation region and intersects said first isolation region at a second predetermined width, said second predetermined width being smaller than said first predetermined width.

44. The semiconductor device of claim 40, wherein said shallow trench isolation structure contains a dielectric material therein.

45. The semiconductor device of claim 44, wherein said dielectric material is a high density plasma oxide.

46. The semiconductor device of claim 44, wherein said shallow trench isolation structure further contains an insulating layer formed between said dielectric material and said substrate.

47. The semiconductor device of claim 46, wherein said insulating layer is formed of silicon nitride.

48. A semiconductor device, comprising:
 a substrate; and
 a shallow trench isolation structure on said substrate for providing device isolation, said shallow trench isolation structure having a rounded profile within said substrate.

49. The semiconductor device of claim 48, wherein said shallow trench isolation structure with rounded profile contains a dielectric material therein.

50. The semiconductor device of claim 49, wherein said dielectric material is a high density plasma oxide.

51. The semiconductor device of claim 49, wherein said shallow trench isolation structure with rounded profile further contains an insulating layer formed between said dielectric material and said substrate.

52. The semiconductor device of claim 51, wherein said insulating layer is formed of silicon nitride.

53. A processor-based system, comprising:
 a processor; and
 an integrated circuit coupled to said processor, at least one of said integrated circuit and processor comprising a shallow trench isolation structure, said shallow trench isolation structure being formed on a substrate and having rounded corners and a tiered profile.

54. The processor-based system of claim 53, wherein said shallow trench isolation structure is formed on said processor.

55. The processor-based system of claim 53, wherein said shallow trench isolation structure is formed on said integrated circuit.

56. The processor-based system of claim 53, wherein said shallow trench isolation structure further comprises at least a first and second isolation regions.

57. The processor-based system of claim 56, wherein said first isolation region intersects a surface of said substrate at a first predetermined width.

58. The processor-based system of claim 57, wherein said second isolation region is formed bellow said first isolation region and intersects said first isolation region at a second predetermined width, said second predetermined width being smaller than said first predetermined width.

59. The processor-based system of claim 53, wherein said shallow trench isolation structure contains a dielectric material therein.

60. The processor-based system of claim 59, wherein said dielectric material is a high density plasma oxide.

61. The processor-based system of claim 59, wherein said shallow trench isolation structure further contains an insulating layer formed between said dilectric material and said substrate.

62. The processor-based system of claim 61, wherein said insulating layer is formed of silicon nitride.

63. The processor-based system of claim 53, wherein said integrated circuit is a memory circuit.

64. The processor-based system of claim 63, wherein said memory circuit is a DRAM memory circuit.

65. A processor-based system, comprising:
 a processor; and
 an integrated circuit coupled to said processor, at least one of said integrated circuit and processor comprising a shallow trench isolation structure, said shallow trench isolation structure being formed within a substrate and having a rounded profile within said substrate.

66. The processor-based system of claim 65, wherein said shallow trench isolation structure with rounded profile is formed on said processor.

67. The processor-based system of claim 65, wherein said shallow trench isolation structure with rounded profile is formed on said integrated circuit.

68. The processor-based system of claim 65, wherein said shallow trench isolation structure with rounded profile has a tiered profile.

69. The processor-based system of claim 65, wherein said shallow trench isolation structure with rounded profile contains a dielectric material therein.

70. The processor-based system of claim 69, wherein said dielectric material is a high density plasma oxide.

71. The processor-based system of claim 69, wherein said shallow trench isolation structure with rounded profile further contains an insulating layer formed between said dielectric material and said substrate.

72. The processor-based system of claim 71, wherein said insulating layer is formed of silicon nitride.

73. The processor-based system of claim 72, wherein said integrated circuit is a memory circuit.

74. The processor-based system of claim 73, wherein said memory circuit is a DRAM memory circuit.

* * * * *

UNITED STATES PATENT AND TRADEMARK OFFICE
CERTIFICATE OF CORRECTION

PATENT NO. : 6,437,417 B1
DATED : August 20, 2002
INVENTOR(S) : Terry L. Gilton

It is certified that error appears in the above-identified patent and that said Letters Patent is hereby corrected as shown below:

Column 5,
Line 46, "onother" should read -- another --

Column 10,
Line 59, "dopants" should read -- dopant --.

Signed and Sealed this

Twenty-eighth Day of January, 2003

JAMES E. ROGAN
*Director of the United States Patent and Trademark Office*